(12) United States Patent
Hsieh

(10) Patent No.: US 6,521,484 B1
(45) Date of Patent: Feb. 18, 2003

(54) MOLD INJECTION METHOD FOR SEMICONDUCTOR DEVICE

(75) Inventor: Wen-Lo Hsieh, Kaohsiung (TW)

(73) Assignee: Orient Semiconductor Electronics, Ltd., Kaosiung (TW)

( * ) Notice: Subject to any disclaimer, the term of this patent is extended or adjusted under 35 U.S.C. 154(b) by 0 days.

(21) Appl. No.: 09/305,367

(22) Filed: May 5, 1999

Related U.S. Application Data

(63) Continuation-in-part of application No. 08/780,208, filed on Jan. 8, 1997, now abandoned.

(51) Int. Cl.⁷ .............................................. H01L 21/44
(52) U.S. Cl. ...................... 438/111; 438/112; 438/123; 438/124
(58) Field of Search ................................ 438/112, 111, 438/113, 123, 124, 125, 126, 127

(56) References Cited

U.S. PATENT DOCUMENTS

| | | | | |
|---|---|---|---|---|
| 5,336,931 A | * | 8/1994 | Juskey et al. | 174/52.2 |
| 5,652,185 A | * | 7/1997 | Lee | 29/840 |
| 5,663,106 A | * | 9/1997 | Karavakis et al. | 257/791 |
| 5,907,477 A | * | 5/1999 | Tuttle et al. | 174/260 |
| 6,310,298 B1 | * | 10/2001 | Barrett et al. | 174/250 |

\* cited by examiner

*Primary Examiner*—Kevin M. Picardat
(74) *Attorney, Agent, or Firm*—Rosenberg, Klein & Lee

(57) ABSTRACT

The present invention provides a mold injection method for semiconductor device by which the problem of residual metal is overcome. The inventive method comprises following steps: die attaching; wire bonding; attaching solder-resisting tape around the die; molding; removing the older-resisting tape; marking; ball placement: and singulation.

2 Claims, 5 Drawing Sheets

MOLD INJECTION METHOD FOR SEMICONDUCTOR DEVICE

CROSS-REFERENCE TO RELATED PATENT APPLICATIONS

This is a continuation-in-part application of patent application Ser. No. 08/780,208, filed Jan. 8, 1997, entitled Method and Apparatus for Molding Semiconductor, now abandoned.

FIELD OF THE INVENTION

The present invention relates to a mold injection method for use in manufacture of resin or plastic molded type semiconductor, and more particularly, to mold injection method for semiconductor device by which the problem of residual metal is overcome. Background of the invention

BACKGROUND OF THE INVENTION

Normally, for encapsulation of semiconductor devices, a molding compound is introduced by injection to enclose the semiconductor die to be packaged. FIG. 1 shows a conventional molding injection device for semiconductor wherein an injection opening 1 is arranged beside one edge of the semiconductor die to be packaged. The injection opening 1 is made of metal coil such as copper coil and connected to the non-wiring part of the leadframe outside the die to prevent the short circuited problem. The injection opening 1 is generally arranged on the top left corner of the leadframe for introducing the molding compound into the package to provide water-proof, static-proof properties to the package. Moreover, a vent hole 2 is also provided on the molding device. Beside the injection opening 1, a plated copper coil 3 can be arranged on the top of the leadframe of the leadframe for introducing the molding compound into the package. However, in above two methods, the injection opening 1 or the plated copper coil 3 should be removed after the molding process is executed. The removing process is time- and labor-consuming. Moreover, metal may be resided on the leadframe, resulting short circuited problem to the package.

It is an object of the present invention to provide a mold injection method for semiconductor device by which the problem of residual metal is overcome.

The inventive molding method comprises following steps:

1) die attaching;
2) wire bonding;
3) attaching solder-resisting tape around the die;
4) molding;
5) removing the older-resisting tape;
6) marking;
7) ball placement: and
8) singulation;

wherein the steps 3 and 5 are different to those of conventional mold injection method.

1) attaching a hollow rectangular shaped tape on a leadframe;
2) die attaching;
3) wire bonding;
4) molding;
5) removing the solder-resisting tape 6) marking,
7) ball placement: and
8) singulation;

wherein the steps 1 and 5 are different to those of conventional mold injection method.

The present invention has following advantages:

1. The tape can be easily removed and no residual metal is left such that the short circuited problem is overcome.
2. The task of tooling is simpler.
3. The design of the injection opening is flexible by using solder-resisting tape.
4. The inventive method is applicable to mass production, The various objects and advantages of the present invention will be more readily understood from the following detailed description when read in conjunction with the appended drawing, in which:

DETAIL DESCRIPTION OF PREFERRED EMBODIMENT

Figure 4:
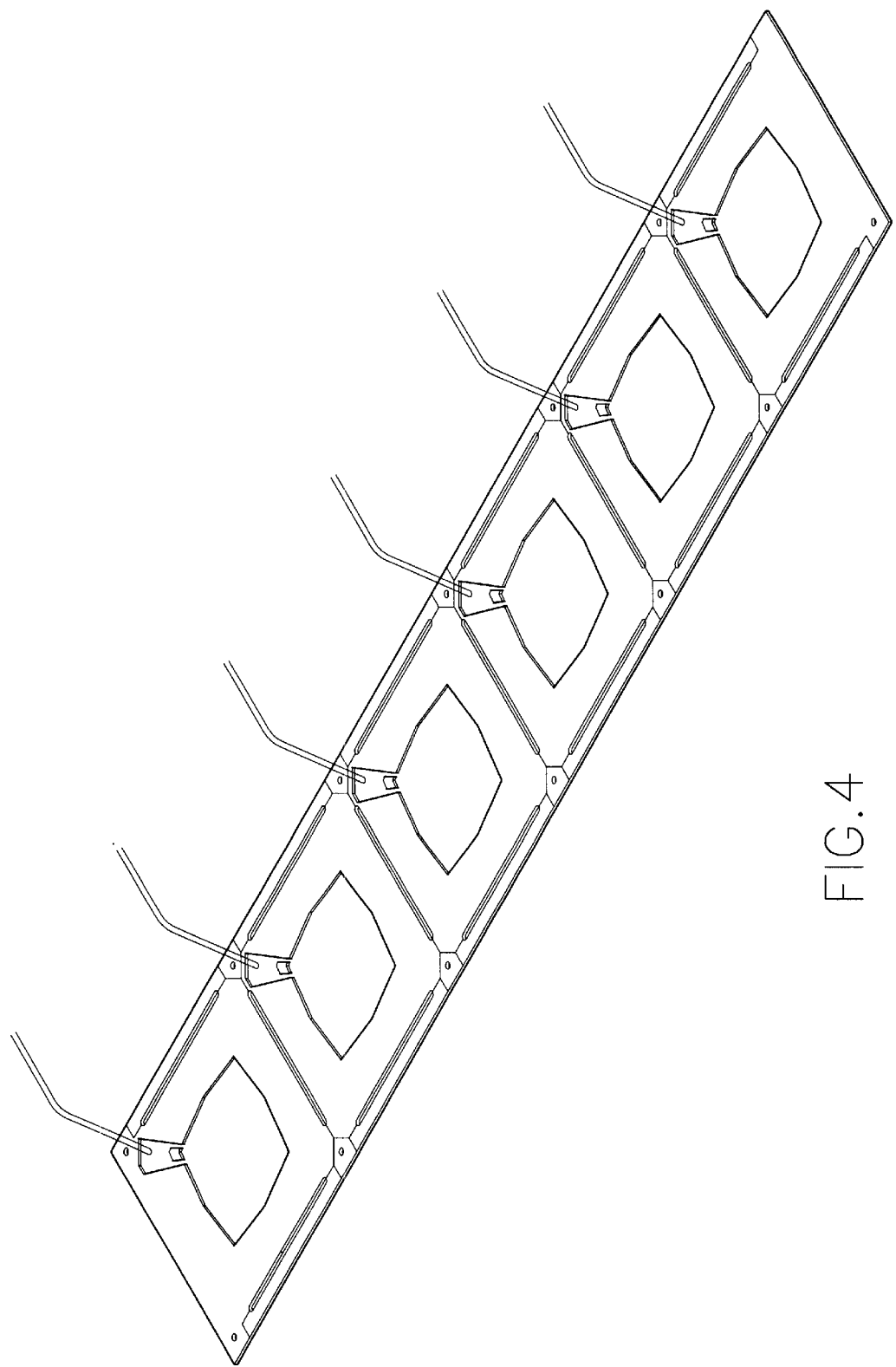
FIG. 4 depicts the process adopting the tape shown in FIG. 2.

With reference to FIG. 4, after the die attaching and wire bonding steps, a older-resisting tape 43 is attached on one corner of the die 41 and an inlet 42 is provided and connected to the runner (not shown). After the solder-resisting tape attaching process, the molding compound is injected along the solder-resisting tape, and then the solder-resisting tape is removed. Afterward, the marking step, the ball placement and singulation steps are performed. The solder-resisting tape is formed to have funnel shape to facilitate the injection of molding compound.

Figure 1:
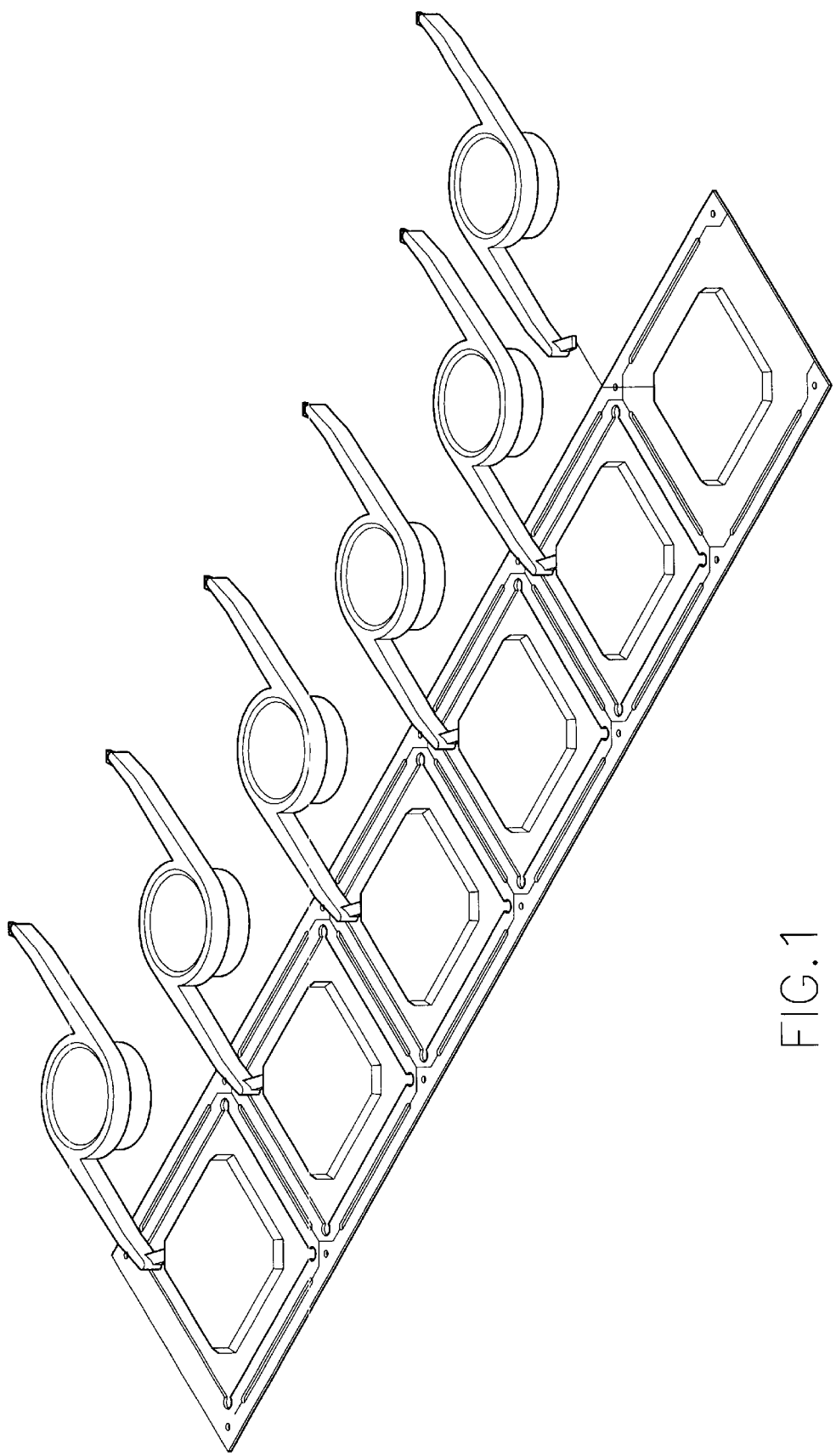
FIG. 1 shows the conventional injection method.
Figure 2:
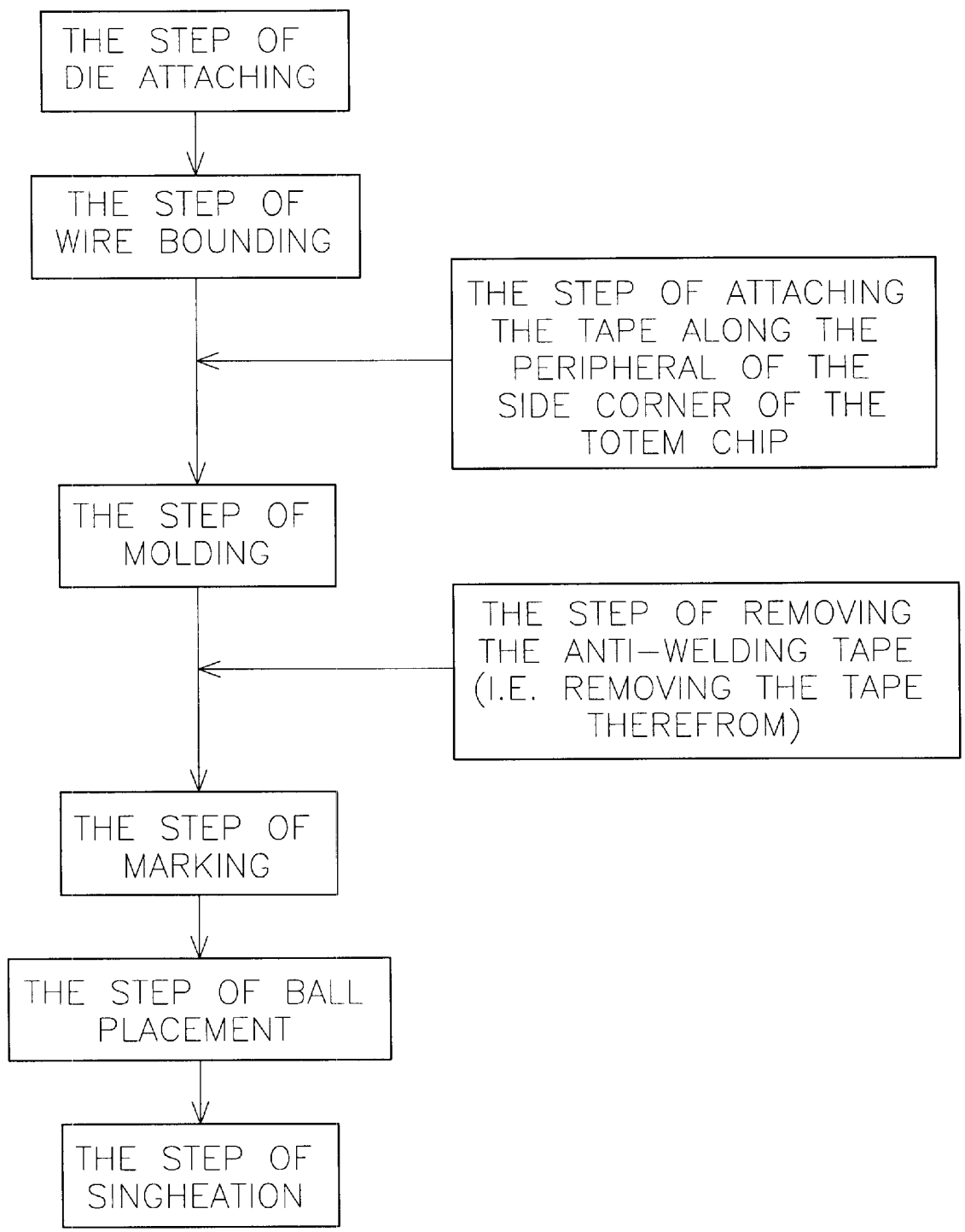
FIG. 2 shows an injection method according to the present invention.
Figure 3:
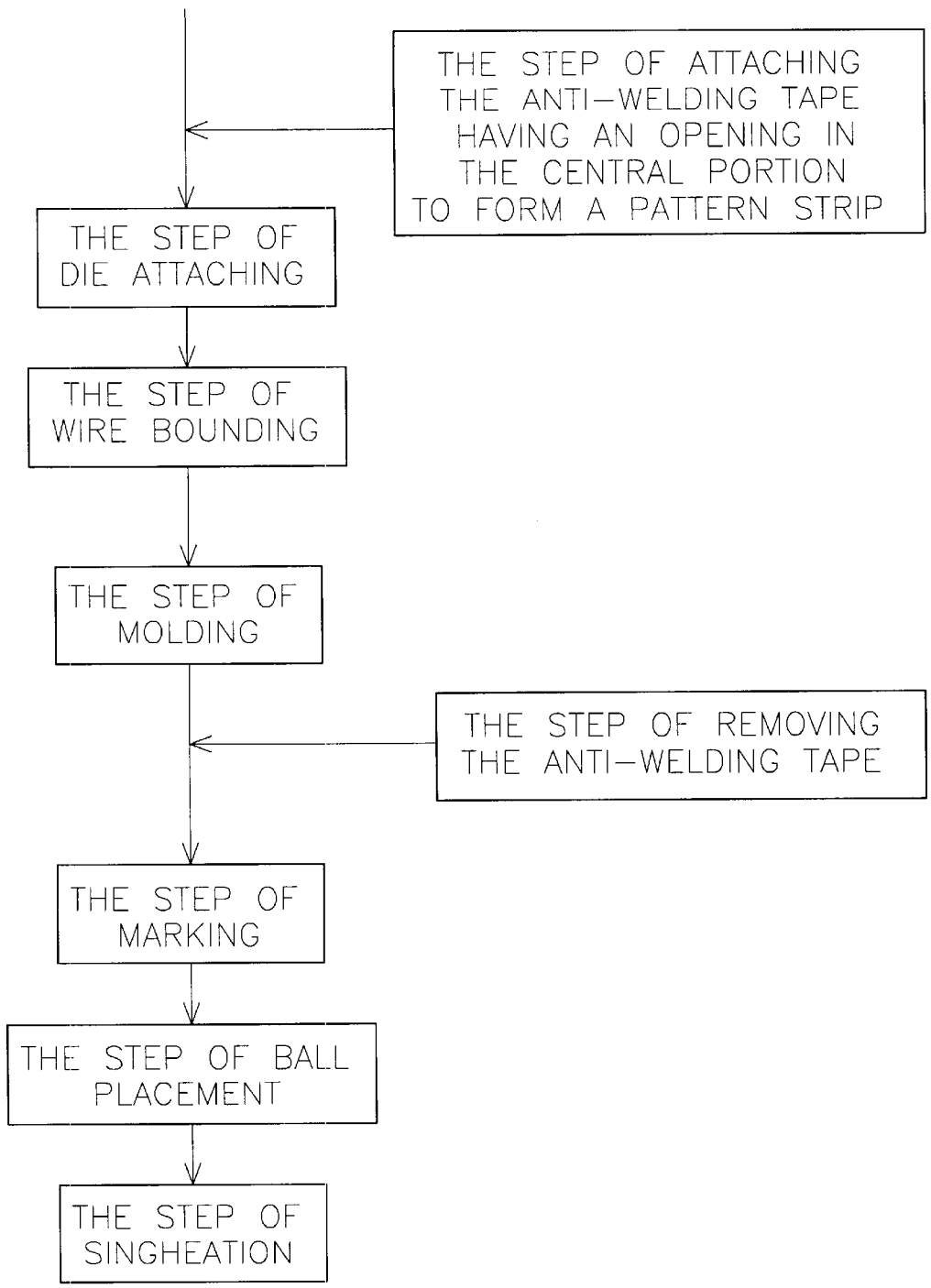
FIG. 3 shows another injection method according to the present invention.
Figure 5:
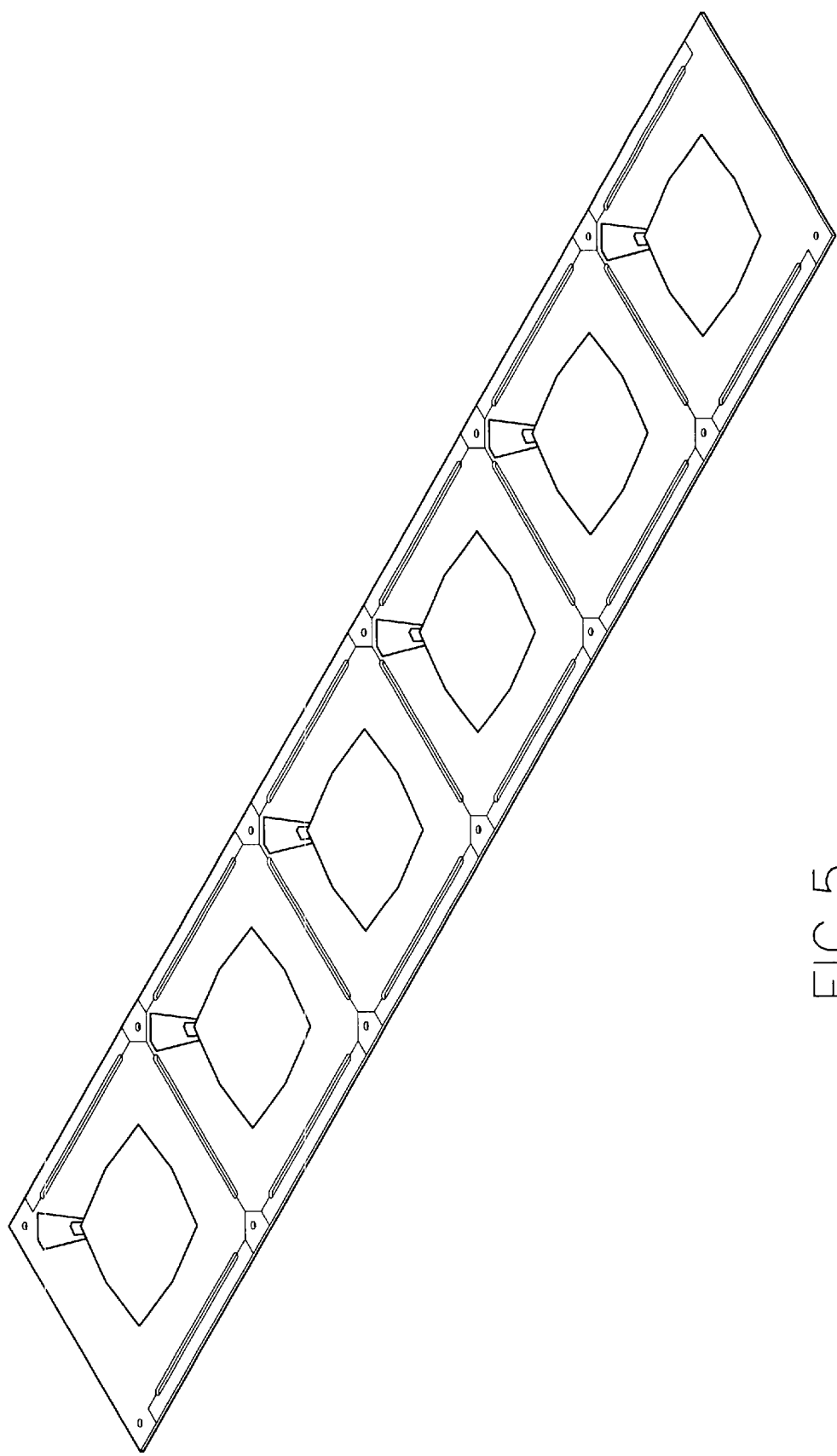
FIG. 5 depicts the process adopting the tape shown in FIG. 3.

FIG. 5 depicts the process adopting the tape shown in FIG. 3. At first a hollow rectangular shaped solder-resisting tape 51 as shown in FIG. 3 is attached on a leadframe and has a hollow center portion for placing a die to be packaged. Afterward, the die attaching, wire bonding and molding process are performed, wherein the molding compound is injected through the injection opening 52 connected with runner (not shown). Then the hollow rectangular shaped tape 51 is removed and followed by marking, ball placement and singulation steps. The solder-resisting tape 51 is hollow rectangular shaped. The molding compound is injected from the outer side of the solder-resisting tape 51, and the center part of the solder-resisting tape 51 is a hollow portion for placing the die to be packaged.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:
1. A mold injection method for a semiconductor device, comprising the steps of:
   a) attaching a die to a leadframe;
   b) performing a wire bonding operation;
   c) applying a solder-resisting tape around the die;
   d) injecting a molding compound along the solder-resisting tape to encapsulate the die;
   e) removing the solder-resisting tape from around the encapsulated die;
   f) marking the encapsulated die; and,
   g) attaching solder balls and performing singulation.

2. A mold injection method for a semiconductor device, comprising the steps of:
   a) providing a rectangularly shaped solder-resisting tape having centrally disposed opening formed therein;
   b) applying the solder-resisting tape to a leadframe;
   c) positioning a die in the central opening of the solder-resisting tape and attaching the die to the lead frame;
   d) performing a wire bonding operation;
   e) injecting a molding compound into the opening of the solder-resisting tape to encapsulate the die;
   f) removing the solder-resisting tape from the leadframe;
   g) marking the encapsulated die; and,
   h) attaching solder balls and performing singulation.

* * * * *